(12) United States Patent
Rao

(10) Patent No.: US 6,256,256 B1
(45) Date of Patent: Jul. 3, 2001

(54) DUAL PORT RANDOM ACCESS MEMORIES AND SYSTEMS USING THE SAME

(75) Inventor: G. R. Mohan Rao, McKinney, TX (US)

(73) Assignee: Silicon Aquarius, Inc.

( * ) Notice: Subject to any disclaimer, the term of this patent is extended or adjusted under 35 U.S.C. 154(b) by 0 days.

(21) Appl. No.: 09/141,490

(22) Filed: Aug. 28, 1998

Related U.S. Application Data

(63) Continuation-in-part of application No. 09/016,559, filed on Jan. 30, 1998, now Pat. No. 5,963,468.

(51) Int. Cl.$^7$ .................................................. G11C 8/00
(52) U.S. Cl. .............................. 365/230.05; 365/189.04; 365/149
(58) Field of Search ........................ 365/189.04, 230.05, 365/149

(56) References Cited

U.S. PATENT DOCUMENTS

| | | | |
|---|---|---|---|
| 4,203,159 | * 5/1980 | Wanlass | 365/149 X |
| 5,007,022 | 4/1991 | Leigh | 365/189.04 |
| 5,010,519 | 4/1991 | Yoshimoto et al. | 365/149 |
| 5,500,654 | * 3/1996 | Fujimoto | 345/132 |

OTHER PUBLICATIONS

"Transparent–Refresh DRAM (TreD) Using Dual–Port DRAM Cell" by Sakurai, Nogami, Sawada and Iizuka, 1988 IEEE Custom Integrated Circuits Conference p. 4.3.1 through 4.3.4.

* cited by examiner

Primary Examiner—Huan Hoang
(74) Attorney, Agent, or Firm—James J. Murphy, Esq.

(57) ABSTRACT

Memory 900 includes an array 401 of rows and columns of memory cells, each row associated with first and second wordlines and each column associated with first and second bitlines. A first port (PORT1) is utilized for accessing selected ones of the memory cells using the first wordline and the first bitline of corresponding ones of the rows and columns, first port (PORT1) associated with first dedicated sets of address, data, clock and control signal terminals for supporting accesses via first processing device 101 using a time base and an access-type required by such first processing device. A second port (PORT2) is utilized for accessing selected ones of the memory cells using the second wordline and the second bitline of corresponding ones of the rows and columns, second port (PORT2) associated with second dedicated sets of address, data, clock and control signal terminals for supporting access by a second processing device 1002.

19 Claims, 10 Drawing Sheets

DUAL PORT RANDOM ACCESS MEMORIES AND SYSTEMS USING THE SAME

CROSS-REFERENCE TO RELATED APPLICATION

This is a Continuation-in-Part of: patent application Ser. No. 09/016,559, entitled "LOW LATENCY MEMORIES AND SYSTEMS USING THE SAME", by G. R. Mohan Rao, filed Jan. 30, 1998 now U.S. Pat. No 5,963,468.

TECHNICAL FIELD OF THE INVENTION

The present invention relates in general to electronic memories and in particular to dual port random access memories and systems using the same.

BACKGROUND OF THE INVENTION

There are numerous ways in which a dynamic random access memories (DRAMs) are traditionally constructed, using variations in process, circuit designs, and system architecture. By varying these parameters, various problems related to device size and performance can be addressed. None the less, all currently available DRAMs are generally based upon architectures which share the following disadvantageous characteristics.

First, the typical general purpose DRAM has a single data port for writing and reading data to and from addressed storage locations ("dual ported" DRAMs are available which provide two data ports, typically one random and one serial port, however, these devices are normally limited to special memory applications). Second, data writes and reads are only made to a given array on a location by location (e.g. one bit, one byte, one word) basis and only during the array active cycle. Specifically, in a "random access mode", an access (read or write) is made to a single location per row address strobe (/RAS) active cycle and in a "page mode" an access is made to a single location per column address strobe (/CAS) or master clock cycle of the row addressed during the given /RAS cycle. During the inactive cycle, the array is in precharge and no accesses can be made to that array.

Third, no method has generally been established to handle contention problems which arise when simultaneous requests for access are made to the same DRAM unit. Current techniques for handling contention problems depend on the DRAM and/or system architecture selected by the designer and range, for example, from "uniform memory-noncontention" methods to "non-uniform memory access" (NUMA) methods.

Similarly, the system architectures of personal computers (PC's) generally share a number of common features. For example, the vast majority of today's PC's are built around a single central processing unit (CPU), which is the system "master." All other subsystems, such as the display controller, disk drive controller, and audio controller then operate as slaves to the CPU. This master/slave organization is normally used no matter whether the CPU is a complex instruction set computer (CISC), reduced instruction set computer (RISC), Silicon Graphics MIPS device or Digital Equipment ALPHA device.

Present memory and PC architectures, such as those discussed above, are rapidly becoming inadequate for constructing the fast machines with substantial storage capacity required to run increasingly sophisticated application software. The problem has already been addressed, at least in part, in the mainframe and server environments by the use of multiprocessor (multiprocessing) architectures. Multiprocessing architectures however are not yet cost effective for application in the PC environment. Furthermore, memory contention and bus contention are still significant concerns in any multiprocessing system, let alone in a multiprocessing PC environment.

Thus, the need has arisen for new memories for use in high speed and/or multiprocessing systems. Preferably, such memories should have a "transparent" precharge and/or multiple random access ports. Additionally, these memories should be capable of use in addressing memory contention problems, especially those occurring in multiprocessing systems.

SUMMARY OF THE INVENTION

According to one embodiment of the principles of the present invention, a memory is disclosed including an array of rows and columns of memory cells, each row associated with first and second wordlines and each column associated with first and second bitlines. A first port is used for accessing selected ones of the memory cells using the first word line and the first bitlines of corresponding rows and columns, the first port associated with first dedicated sets of address, data, clock and control signal terminals for supporting accesses by a first processing device using a time base and an access-type required by the first processing device. A second port is used for accessing selected ones of the memory cells using the second wordline and the second bitline of corresponding ones of the rows and columns, the second port associated with second dedicated sets of address, data, clock and control signal terminals for supporting access by a second processing device using a time base and an access type required by the second processing device.

Further principles of the present inventions are embodied in a frame buffer having a first port with dedicated address, data and control signal inputs for updating display data within the memory using timing parameters and access types optimized for use with a selected processing device and a second port having dedicated address, data and control signal inputs for supporting simultaneous and asynchronous accesses to the frame buffer by a display controller.

Also a system is also disclosed which includes a first processing device operating in accordance with first clock and a first set of memory access parameters and a second processing device operating in accordance with a second clock and a second set of memory access parameters. The system also includes a multiport memory including first and second ports. First port is coupled to the first processing device and operating in accordance with the first clock and the first set of access parameters. The second port is coupled to the second processing device and operating in accordance with the second clock and the second set of access parameters. Memory includes an array of rows and columns of memory cells, each memory cell including a capacitor and first and second pass transistors, the first pass transistor for coupling the capacitor to a first bitline in response to an active signal on a first wordline and the second pass transistor coupling the capacitor to a second bitline in response to an active signal on a second wordline, the first port accessing a selected cell using the first bitline and the first wordline and the second port accessing a selected cell using the second bitline and the second wordline.

The present inventive concepts provide substantial advantages over the prior art. Among other things, two different processing resources can simultaneously access the same memory. Additionally, different processing resources can use different types of memory accesses through the different ports simultaneously. Finally, those processing resources can perform simultaneous accesses using different timing parameters.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

12B shows the 8:2:2:1 timing for a second port of the multiport memory.

DETAILED DESCRIPTION OF THE INVENTION

The principles of the present invention and their advantages are best understood by referring to the illustrated embodiment depicted in FIGS. 1–8 of the drawings, in which like numbers designate like parts.

Figure 1A:
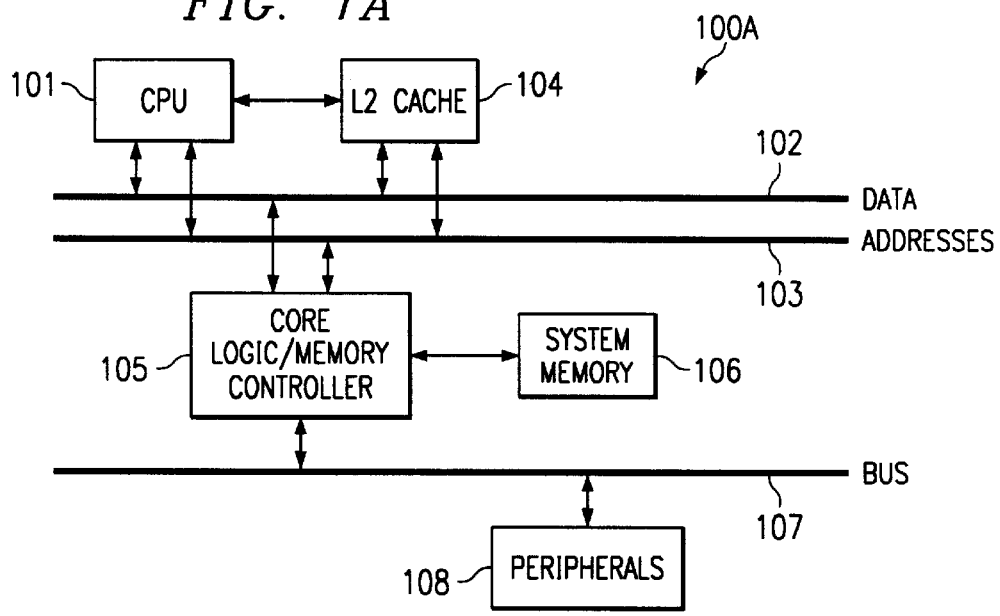
FIGS. 1A and 1B are block diagrams respectively depicting two basic system architectures typical of those found in personal computers (PC's)
Figure 1B:
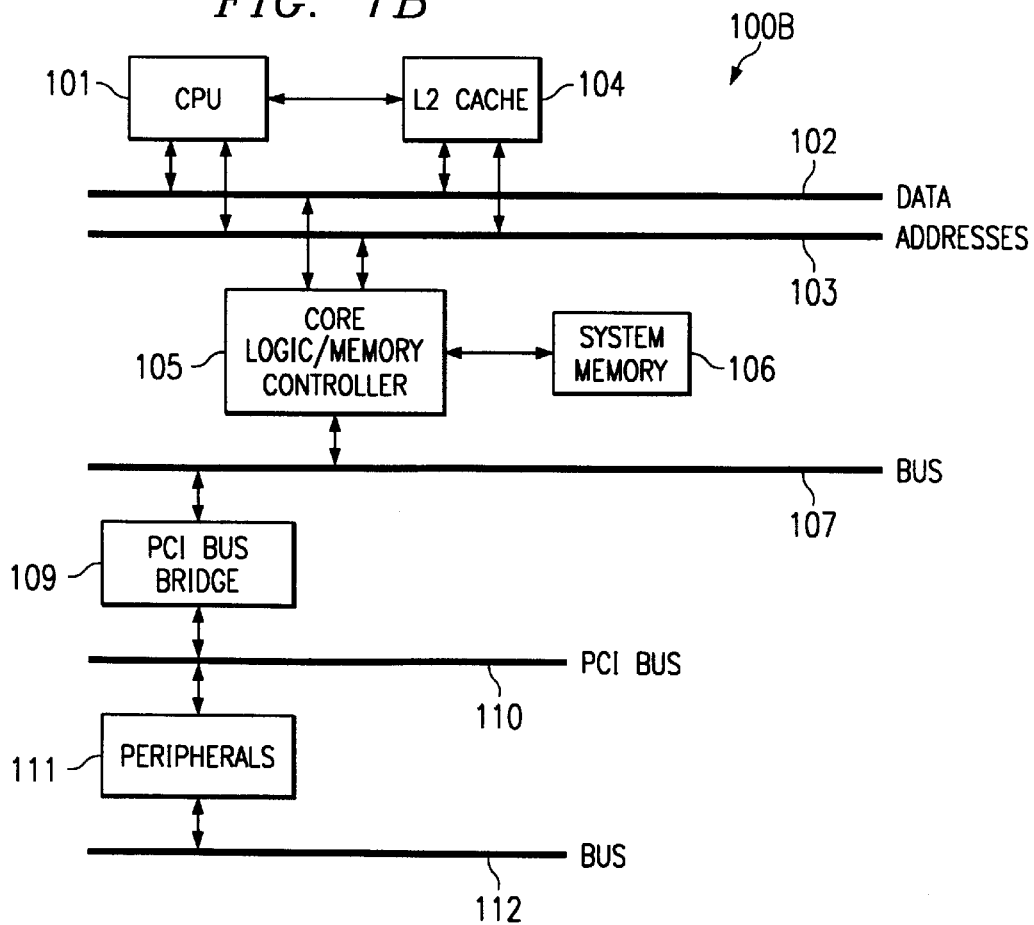

FIGS. 1A and 1B are block diagrams respectively depicting two basic system architectures 100A and 100B typical of those found in personal computers (PC's). While numerous variations on these basic architectures exist, FIGS. 1A and 1B are suitable for describing the basic structure and operation of most PCs.

Both systems 100A and 100B include a single central processing unit 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge then interfaces bus 107 with a PCI bus 110, to which the peripherals 111 couple. An additional bus 112, which may be a ISA, PCI, VESA, IDE, general, or special purpose bus, is provided for access to peripherals 111 from an external device or system (not shown).

In single CPU systems 100A and 100B, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium™ class microprocessor, a reduced instruction set computer (RISC), such as a Apple PowerPC™ microprocessor, or a very long instruction word (VLIW) machine.

CPU 101 communicates with the remainder of system 100 via CPU local address and data buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application well known by those skilled in the art. The memory controller can be either a separate device or incorporated into the same chip set as the core logic. The memory controller is generally responsible for generating the memory clocks and control signals such as SCLK (System Clock) /RAS, /CAS, R/W and bank select, and Monitors and controls cell refresh. The memory controller may also have some address generation capability for accessing sequences of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache coherency, including the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/memory controller 103 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 107/111 may include a display controller and associated frame buffer, floppy drive controller, disk driver controller, and/or modem, to name only a few options.

The principles of the present invention may also be embodied in multiprocessing devices and systems. Although a number multiprocessing architectures exist to which the principles of the present invention can be applied, FIGS. 2A, 2B and 2C respectively depict exemplary multiprocessor architectures 200A, 200B and 200C for discussion purposes.

Multiprocessing system 200A is based upon n number of CPUs 201. Each CPU 201 is associated with a dedicated cache 202 and dedicated (private) system memory 203. Common bus 204 allows a given CPU to exchange information with peripherals, including mass storage subsystems 204, such as disk drives, tape drives and cartridge units, and Input/Output subsystems 206, such as printers, displays and keyboards.

The memory organization of system 200A is typically categorized under the "no read/write memory access" (NORMA) paradigm. In NORMA based systems, the processors have no access to a common memory and all data sharing between processors occurs over communications links. NORMA typically is used in fully distributed systems.

System 200B also primarily includes n number of CPUs 201, each with an associated cache 202, and coupled to the peripheral devices through a common bus 204. In the case of system 200B, system memory 207 is also coupled to bus 204 and is shared by all the CPUs 201. A second bus 208 is provided as a second path for accessing system memory 207.

The memory architecture of system 200B is typically designated as a unified memory access (UMA) architecture.

Under the UMA paradigm, all processors have equal access to system memory and all processors have local cache. The unified memory access architecture typically provides the fastest possible interaction between processors and is the common architecture used in PCs, work stations, and other desktop computing devices. UMA based systems are often referred to as "symmetric-multiprocessing" systems.

System 200C is a system in which both private and system memory are provided. Specifically, in addition to dedicated cache 202, each CPU 201 is also associated with private memory 209. Each CPU is further connected by bus 204 to a shared system memory 210.

The memory architecture of system 200C falls under the non-uniform memory access (NUMA) paradigm. Under the NUMA paradigm, each processor has a private memory and additionally shares system memory with the other processors in the system. One difficulty in a NUMA based system is the fact that the access times for the private and system memories may be different creating timing problems.

Figure 2A:
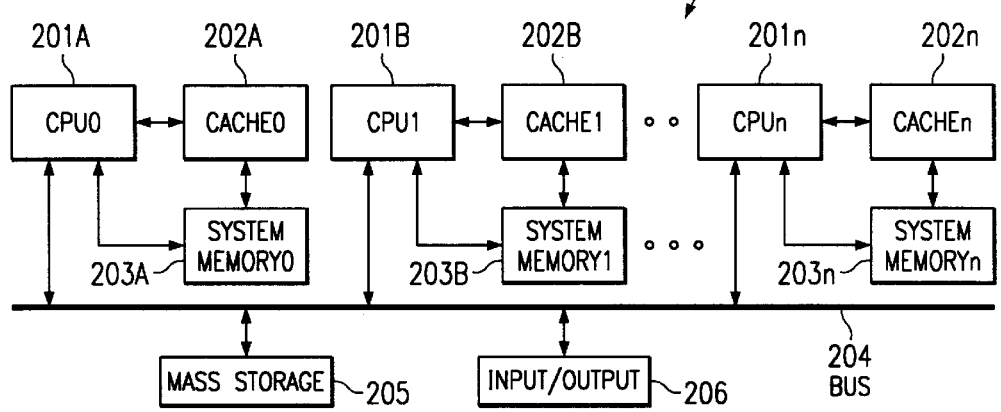
FIGS. 2A, 2B and 2C respectively depict exemplary multiprocessor architectures.
Figure 2B:
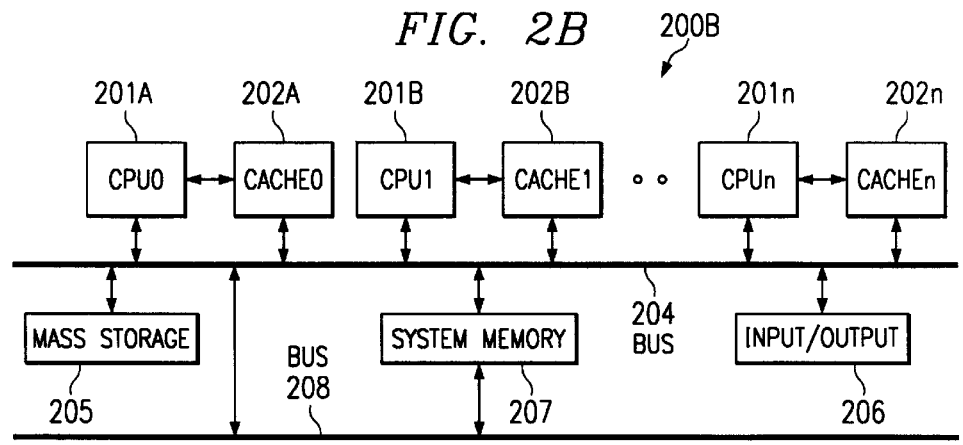
Figure 2C:
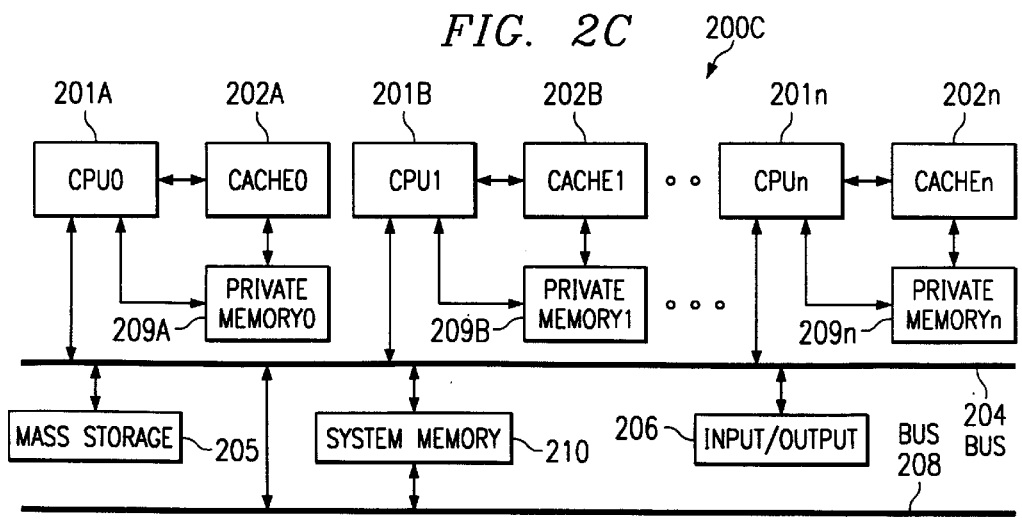

At the highest system level, there are a number of ways to implement the hardware architectures shown in FIGS. 2A, 2B and 2C in a complete hardware/software system. Three such systems are shown in FIGS. 3A–3C, respectively.

Figure 3A:
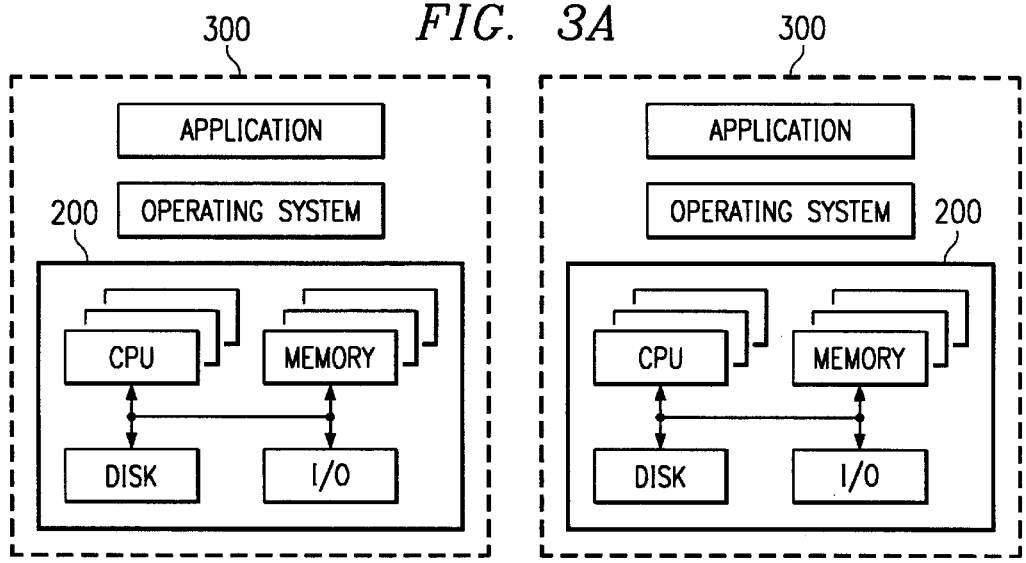
FIG. 3A is a diagram illustrating a "loosely coupled" multiprocessing architecture.

FIG. 3A is a diagram illustrating a "loosely coupled" multiprocessing architecture. In the loosely coupled architecture, each processing node 300 maintains a dedicated copy of both the operating system and the application programs. Loosely coupled architectures, such as that shown in FIG. 3A, are used often in embedded systems and in real-time systems in which tasks must be partitioned to different processing nodes for synchronization purposes. Embedded systems include those in which the CPU is fabricated on the same chip as logic, memory, a signal processor, or the like. High speed interconnects are used to share data and pass messages between processing nodes 300. While loosely coupled systems are more fault and error tolerant, their software programming is most often highly complex.

Figure 3B:
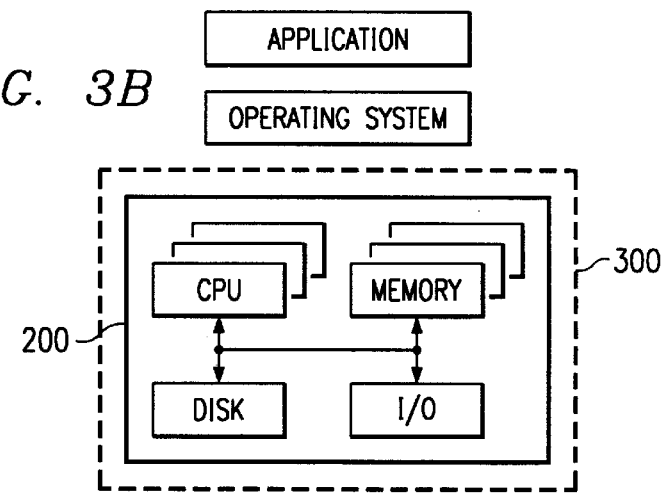
FIG. 3B depicts a "tightly coupled" system. In this case, a single copy of the operating system and a single copy of the application program are shared and executed by a single set of processors.

FIG. 3B depicts a "tightly coupled" system. In this case, a single copy of the operating system and a single copy of the application program are shared and executed by a single set of processors. Advantageously, writing software programs for a tightly coupled system is normally simpler than for writing programs to a loosely coupled system. However, tightly coupled systems, based only on single copies of the application programs and operating system, are less tolerant to errors and failures than the loosely coupled systems.

Figure 3C:
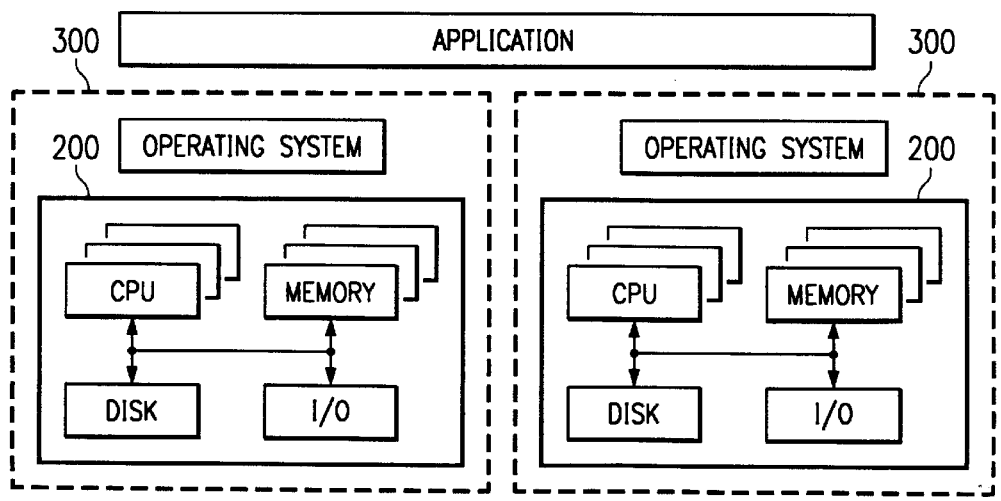
FIG. 3C is a diagram of a "snugly coupled" system in which each processing node maintains a dedicated copy of the operating system and all nodes share a single copy of the applications program.

FIG. 3C is a diagram of a "snugly coupled" system in which each processing node 300 maintains a dedicated copy of the operating system and all nodes share a single copy of the applications program. The snugly coupled variation is a hybrid which provides the tolerance to failure/errors found in loosely coupled systems while still providing the simpler program found in tightly coupled systems.

Generally, under any of the UMA, NUMA or NORMA paradigms, the system will act differently depending upon the type of processor employed. For example, a CISC CPU may be "latency" dominated while a digital signfal processor (DSP) based system may be "dataflow" dominated. Further, pipelined processing algorithms typically are dataflow intensive, since the processors perform operations on streams of data received from other processors in the system and then pass the results on to other processors.

There are major challenges which must be addressed in the design of almost any multiprocessing system. First, if an architecture, such as those used in system 200B or system 200C, in which a single system memory system is shared by multiple processors, the issue of memory contention must be addressed; a technique must be developed to handle the situation in which several processors attempt to simultaneously access the shared memory. This problem is compounded by the fact that the contention issues must be dealt with from design to design, since different processors interface with memory differently. For example, a RISC processor requires substantial memory space while a CISC processor requires substantial register space.

In a memory device or subsystem with a single data input/output port and a single address port, contention problems can be solved by "memory locking." In this case, while one CPU (or controller) is accessing a given memory device or subsystem, the other CPU (controller) is "locked out" and cannot access that same device/subsystem. Memory locking is a memory management task which may be performed by the memory management unit (MMU) on-board the CPUs themselves or by a stand-alone device or subsystem. In any event, memory locking reduces the efficiency which multiprocessing was intended to increase, since during a contention situation, at least one processor must wait to access data.

Another major challenge is the software design. Symmetric multiprocessing operating systems are preferred, since this type of operating system is capable of seamlessly passing application programs to the CPUs as they become available. As discussed above, the selection of between tightly, loosely and snugly coupled software architecture requires substantial trade-offs, and in particular trade offs between ease of programming and fault/error tolerance.

Further, when multiple processors (or controllers) are coupled to the same bus, bus contention problems may also arise. Specifically, when a shared bus is employed, only one processor is normally granted access to the bus to perform a given bus task, while the remainder of the processors coupled to that bus must wait until their priority has been reached. One technique for minimizing bus contention problems, is to provide a dedicated cache for each CPU, as shown in FIGS. 3A–3C, so that a given CPU need only access the bus at times when required data are not found in the dedicated cache. As a result, cache coherency is a major concern in the design of a multiprocessing system. In other words, when a given processor modifies a location in memory, some technique must be provided for insuring that the data is modified in the cache memory of each of the other processors using the same data.

Figure 4:
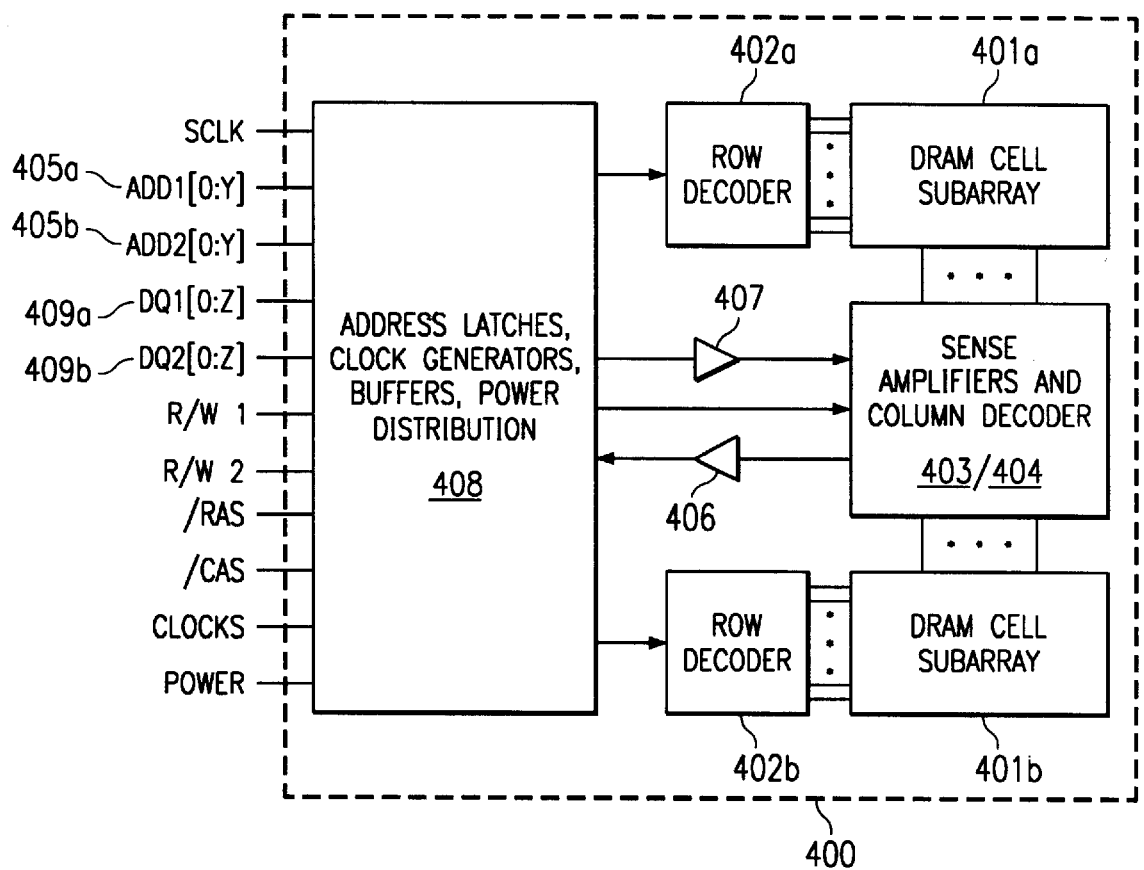
FIG. 4 is a high level functional block diagram of a DRAM memory.

FIG. 4 is a high level functional block diagram of a DRAM memory 400 embodying the teachings of the present invention. Memory 400 is suitable for such applications as system memory 106 in either of the exemplary single processor environments or any of the memories in the exemplary multiprocessing environments, such as private memory 203 of system 200A or shared memory 207 system 200B. Many other applications of memory 400 are possible.

Memory 400 includes a pair of subarrays 401a and 401b, each composed of rows and columns of DRAM cells. Each row of cells is associated with a pair of conductive wordlines and each column of cells is associated with a pair of conductive bitlines. This structure will be discussed in detail below. Generally however, during an access, a row of cells in array 401 is selected in response to a received row address by either row decoders 402a or 402b which activates one of the pair of the conductive wordlines coupled to the cells of the selected row. Data is input to or output from each cell along the row through one of the bitlines associated with the corresponding column (at the same time the other bitline for that column can be put into precharge).

During a read, the data from the entire active row of cells are sensed and latched by sense amplifiers 403. For discussion purposes, it will be assumed that the bitlines are coupled to sense amplifiers 403 in an open-bitline fashion, with complementary bitlines disposed in subarrays 401a and 401b respectively. During a read, column decoder 404, in response to a received column address(es), selectively passes desired data (e.g. in bits, bytes or words) from sense amplifiers 403 from the appropriate locations along the active row. During a write, data are transferred to the proper cells along the active row directly column decoder 404 (data in sense amplifiers 403 are essentially written over).

In the illustrated embodiment, the data passed by column decoder 404 are selectively input to or output from device 400 through two Z-bit wide input/output (I/O) ports 405a (DQ1[0:Z]) and 405b (DQ2[0:Z]). Data being output (read) from memory 400 is driven by a set of read amplifiers 406. During a write, write buffers 407 drive received data from the given I/O port through the column decoder (which selects the bitlines of the cells to be written) and the sense amplifiers to array 401. While two I/O ports 404 are shown for illustration, in some embodiments only one such port is provided. In these cases, the single data I/O port 405, and/or the external data, is multiplexed. As will become apparent, data port 405 can be multiplexed such that one set of bitlines can be accessed during one cycle and a second set accessed during the immediately following cycle. Block 408 generally shows the traditional input/output circuitry, including buffers address latches, power distribution circuitry and clock generation circuitry. In the illustrated embodiment, at least one multiplexed address bus is coupled to an Y-bit wide address port 409 (ADD[0:Y]) from which row addresses are latched in with the row address strobe (/RAS) and column addresses with the column address strobe (/CAS). It should be noted that two address ports, 409a and 409b as shown in FIG. 4, may be used such that two data ports can be independently controlled and/or a single data I/O port controlled by two processors. (/RAS also controls the timing of bitline precharge and sense amplifier set-up; one bitline of each column is precharged and its sense amplifier set-up during the high periods of /RAS and the other bitline precharged and its sense amplifier set-up during the low periods of /RAS.)

Read/write signals R/W1 and R/W2 control the reading and writing of data to and from data ports 405a and 405b respectively. If a single port 405 is provided, then only a single read/write signal is necessary. If DRAM 400 is a synchronous DRAM, the CLOCKS will include the synchronous DRAM master clock (SCLK).

Figure 5:
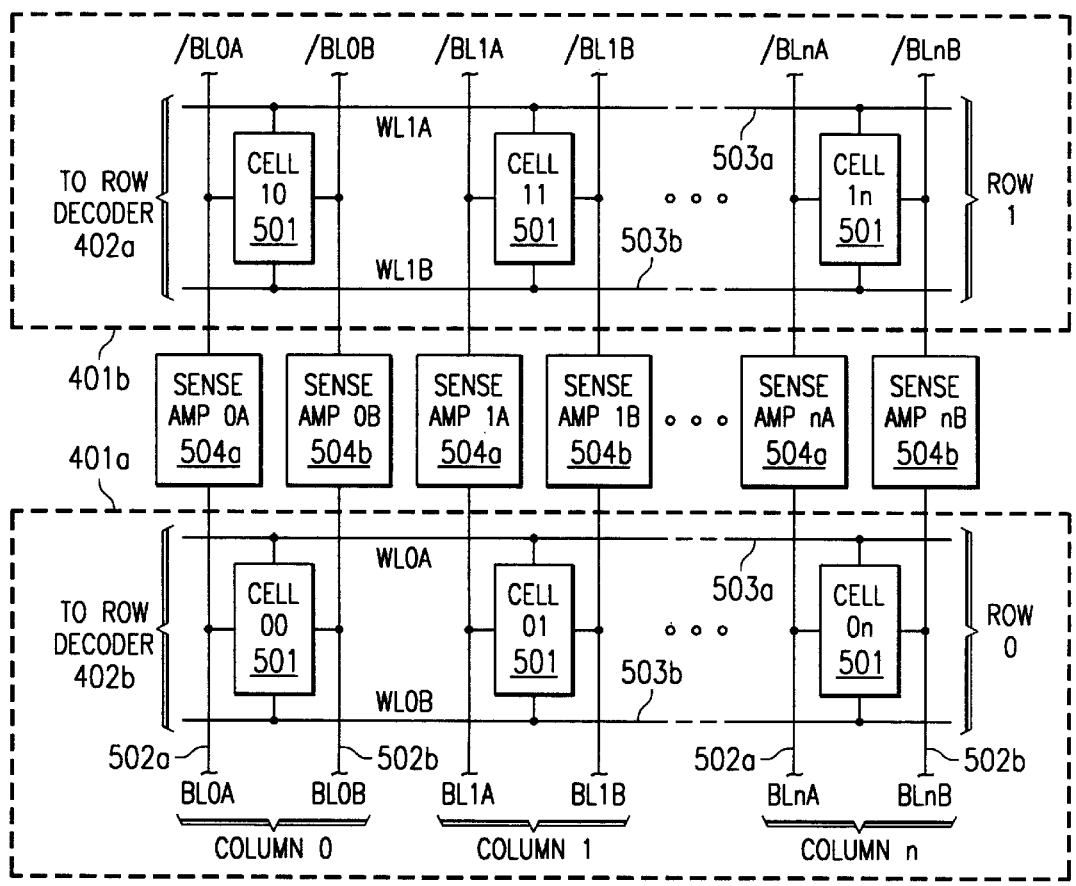
FIG. 5 is a more detailed block diagram of a very small portion of the subarrays and the corresponding sense amplifiers of the memory of FIG. 4.

FIG. 5 is a more detailed block diagram of a very small portion of subarrays 401a and 401b and the corresponding sense amplifiers. Specifically, FIG. 5 shows three exemplary physical columns (Columns 0, 1 and n) and two exemplary rows (Rows 0 and 1) of an m row by n column array, with half of the rows disposed in each of subarrays 401a and 401b. In actual implementation the number of rows and columns will be much larger, the array could be, for example, 1024 rows by 1024 columns (i.e. m=n=1024) or larger.

In the illustrated embodiment of FIG. 5, an open bitline arrangement is employed, although a folded bitline approach could just as easily be used. Each cell 501 in each subarray 401 is coupled to a pair of bitlines 502a and 502b ($BL_iA$ and $BL_iB$, where i is the column number between 0 and n) and a pair of wordlines 503a and 503b ($WL_jA$ and $WL_jB$, where j is the row number between 0 and m). Each bitline 502a/502b of each column is coupled to a corresponding sense amplifier 504a or 504b, with the bitlines of subarrays 401a and 401b being complementary. For illustration, the even numbered pairs of wordlines 503 are shown in subarray 401a and the even numbered pairs shown in subarray 401b.

Figure 6:
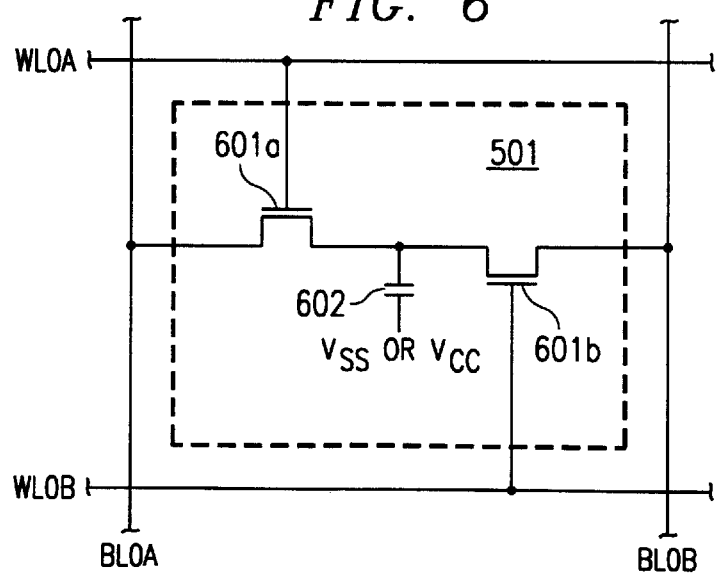
FIG. 6 depicts the preferred structure of cells shown in FIG. 5.

The preferred structure of cells 501 is depicted in FIG. 6. For discussion purposes, the cell at the intersection of wordlines $WL_0A$ and $WL_0B$ and bitlines $BL_0A$ and $BL_0B$ is shown. Each cell includes a first pass transistor 601a for coupling a first plate of data storage capacitor 602 with bitline $BL_0A$ in response to active (high) voltage impressed on $WL_0A$. A second pass transistor 601*b* similarly selectively couples the storage capacitor 602 to bitline $BL_0B$ when an active (high) voltage is presented on $WL_0B$. Both pass transistors, sharing the same "storage capacitor" cannot be simultaneously turned "on". For a complete description of cells 501 and their advantages, reference is now made to copending and coassigned patent application Ser. No. 08/911,737, filed Aug. 15, 1997 and entitled "LOW LATENCY DRAM CELL AND METHOD THEREFOR" incorporated herein by reference.

Figure 7A:
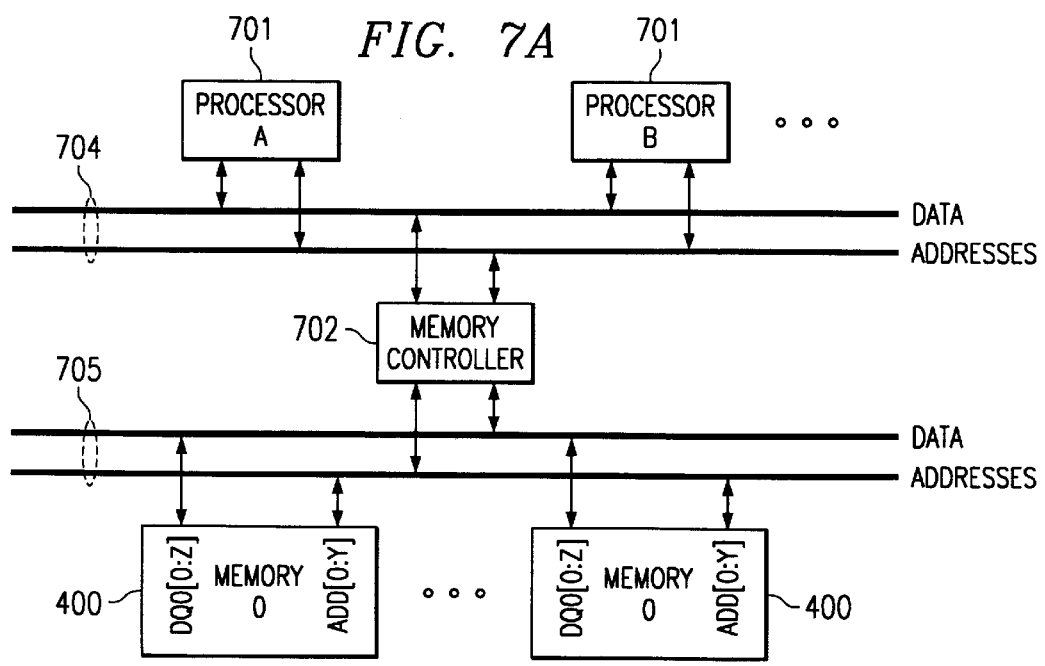
FIG. 7A depicts a multiprocessing environment including m number of processing elements.
Figure 7B:
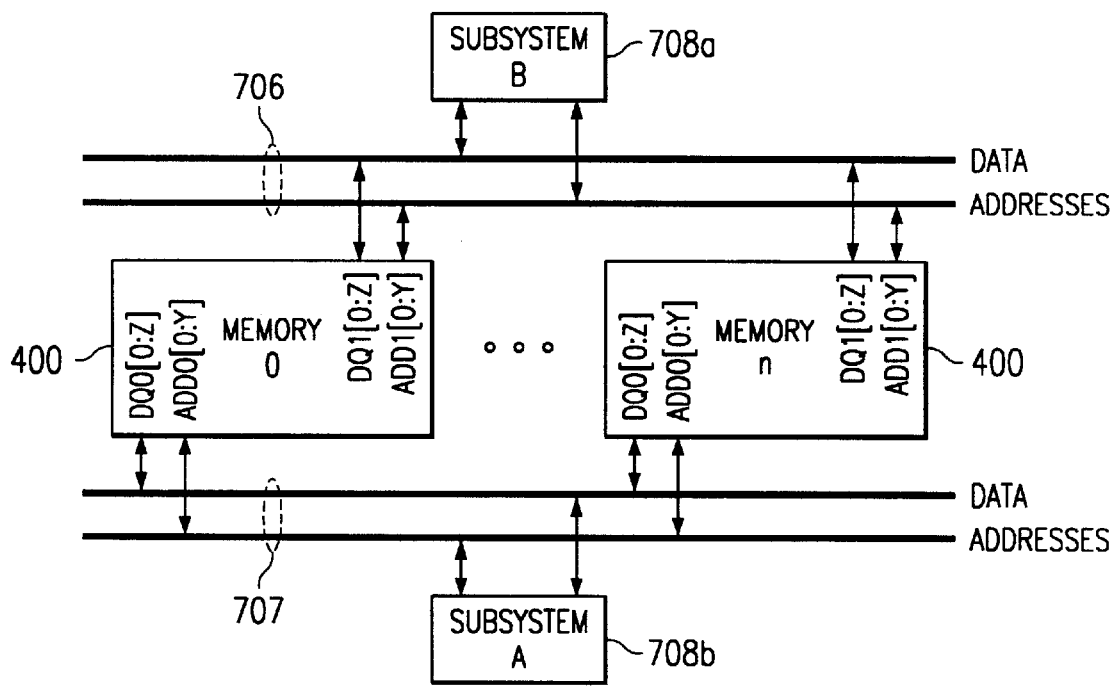
FIG. 7B depicts an exemplary applications for the memory shown in FIG. 4.

There are many possible applications for memory 400, two of which are shown in FIGS. 7A and 7B respectively. The operation of memories 400 in these and other applications will be illustrated in conjunction with the timing diagram of FIG. 7C.

FIG. 7A depicts a multiprocessing environment including m number of processing elements 701, which could be microprocessors, microcontrollers, audio or graphics engines, to name only a few possibilities. A memory controller 702 spans the data and address lines of CPU bus 704 and the data and address lines of memory bus 705. Coupled to memory bus 705 are n number of memories 400, each employing a single address port ADD[0:Y] and a single data port DQ[0:Z].

In the exemplary system shown in FIG. 7B. A pair of buses 706 and 707 are spanned by n number of memories 400. A pair of exemplary subsystems 708*a* and 708*b* are depicted, coupled to buses 706 and 707 respectively. Subsystems may be for example microprocessors or microcontrollers, memory controllers, etc. In contrast the embodiment of FIG. 7A, in this embodiment two address ports ADD0[0:Y] and ADD1[0:Y] and two data ports DQ)0[0:Z] and DQ1[0:Z] are utilized.

Notwithstanding the number of address ports used, the decoding of the received row and column addresses can be done in a number of different ways. For example, addresses received from processor 1 may be decoded to exclusively access wordlines $WL_iA$ and bitlines $BL_iA$ while processor 2 generated addresses access wordlines and bitlines $WL_iB$ and $BL_iA$ exclusively. Alternately, bitlines and wordlines $BL_iA$ and $WL_iA$ can be assigned a first address space and bitlines and wordlines $WL_iB$ and $BL_iB$ assigned a second address space. In this case, one or more address bits would direct the access to the proper address space; all processors in the multiple processor system would have access to both address spaces. Further, all the wordlines and bitlines can be in equivalent address spaces (for example, the row address for wordline $WL_iA$ will equal the row address for wordline $WL_iB$, etc.) In this case a toggle bit would be used to select between the "A" set of bitlines and wordlines and the "B" set of wordlines and bitlines. This toggle bit could be generated by the core logic or memory controller and would insure that two successive accesses to the same set are not made during the same period of the /RAS cycle. (The rising and falling edges of /RAS could also serve the functions of the toggle bit.)

The operation of memories 400 can now be described. For purposes of discussion, and as shown in FIG. 2, it is being arbitrarily assumed that one or more of the bitlines $BL_iA$ are active during the period when /RAS is at a logic low one or more of the bitlines $BL_iB$ is in precharge when /RAS is low and active when /RAS is high.

First consider the case where a single address port ADD and two data ports are used. On the falling edge of /RAS, a row address is latched-in through address port ADD for activating the wordline $WL_iA$ of the selected row, for example wordline WL0A of Row 0. Also, when /RAS transitions low, the active state for bitlines $WL_iA$ and corresponding sense amplifiers 504*a* begins. At the same time, precharge of bitlines $BL_iB$ is initiated. Shortly thereafter, pass transistor 601*a* of each cell 501 of Row 0 is turned-on and capacitors 602 for that row are available for access through bitlines $BL_iA$. For a read, the data are sensed and latched in sense amplifiers 504*a*. In the case where Row 0 is selected, bitlines $BL_iA$ of subarray 401*a* carry data and bitlines $BL_iA$ of subarray 401*b* are used as the complementary bitlines for sensing purposes. On each falling edge of /CAS, a column address is latched-in through address port ADD and the words of data are transferred to or from the sense amplifier 501*a* via first data port DQ0 (/CAS can also be generated on-chip). The width of each word of data is a design choice; in a by 16 device 16 bits are accessed per column address (/CAS cycle). The number of words paged out during the time when /RAS is low can vary from one up to the maximum number of words per row, depending on the application.

With the rising edge of /RAS, bitlines $BL_iA$ are precharged and sense amplifiers 504*a* prepared for the next low period of /RAS. At the same time, bitlines $BL_iB$ and sense amplifiers 504*b* become available. Again row and column addresses are latched-in through address port ADD with the falling edges of /RAS and /CAS. During the high period of /RAS, the row address received and decoded accesses one of the "B" wordlines $WL_jB$. The column accesses then occur for bitlines $BL_iB$ in a manner similar to that discussed above with regards to bitlines $BL_iA$.

In view of the foregoing discussion, it becomes readily apparent that memories, such as memory 400, according the present inventive teachings have many advantages over traditional DRAMs. Among other things, precharge is "transparent." In other words, where as in a traditional DRAM data cannot be accessed during the period when /RAS is high, the present teachings allow for data accesses during both the periods when /RAS is high and /RAS is low. Further, memories such as memory 400 are particularly useful in multiprocessing applications In the system of FIG. 7A for example, data can be accessed by Processor A using the "A" bitlines and wordlines during the first half of the /RAS cycle and Processor B can access the same data during the second half of the same /RAS cycle. Not only does this increase processing speed (with two accesses per /RAS cycle) but also helps insure that each processor is accessing the most up to date data.

In the preferred embodiment, two consecutive physical accesses to the "A" bitlines and wordlines, or two consecutive physical accesses to the "B" bitlines and wordlines are not preferred. Thus, some memory management scheme (internal to the chip or external to the chip) or software in the overall system, in FIG. 7A, should be provided to insure that such forbidden accesses are not attempted.

The lower timing trace illustrates double data rate accesses, wherein a word is accessed on both the rising and falling edges of SCLK. For convenience, only a few cycles are shown, although DDR (double data rate) operations can be performed through both DQ ports.

In addition to the applications described above, there are many specific uses of the present concepts. In graphics applications, these concepts can applied to the memory used for texture caching, texture compression and scatter-gather burst mastering. In digital signal processing (DSP) applications, memories such as memory 400 can be used in the construction of either the program memory or the data memory.

Multibank memories can also be constructed according to the present invention. An example of such a multibank memory is shown in FIG. 8 generally similar circuitry common to all banks, can be consolidated to minimize the required circuitry and consequently optimize chip space and power consumption.

A single data port 803 is shown along with a single address port 804. As discussed above, single or multiplied address ports or single or multiple data ports, can be used in any desired combination. The array organization will vary from design to design. For example, a 1 Gigabit device could be organized as sixteen (16) banks each having a cell array 402 of 4 k rows by 256 columns (words) of 64 bits. Internally, the addresses from each of the ports are carried by corresponding address buses 801. Data exchanged with each bank's data port via an internal data bus 802.

Bank select in a multibank memory can be implemented using a selected number of the address bits received from the external controlling device. For example, if sixteen (16) banks are used, then four address bits, for example the 4 MSBs, from each address are required for 1 out of 16 bank selection. For the exemplary 4 k row×256 word memory, 14 bits are required for row addressing and 8 bits for column (word) addressing.

Figure 8:
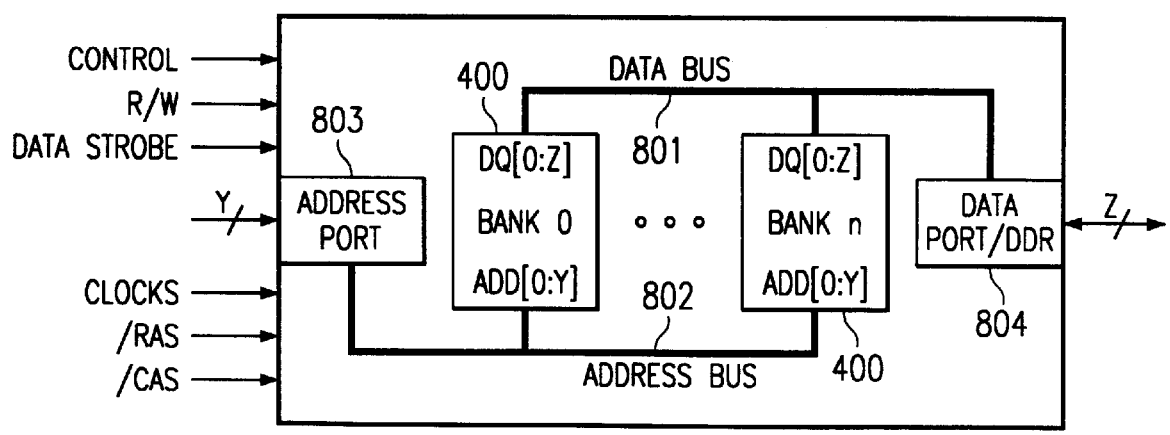
FIG. 8 illustrates an example of a multibank memory.
Figure 7C:
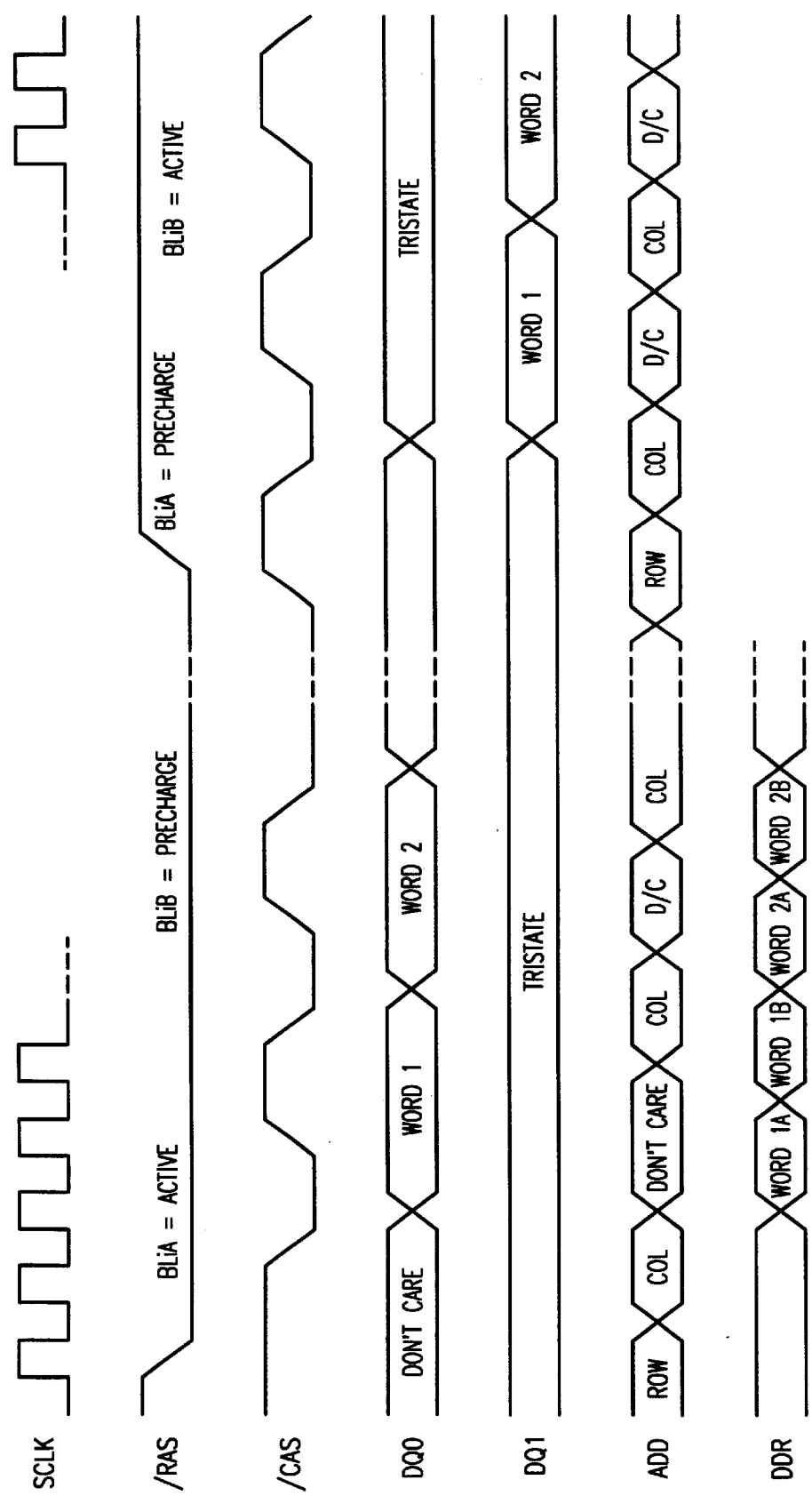
FIG. 7C illustrates operation of the alternative multiprocessing embodiment in which two address ports ADD0 and ADD1 are used for accessing memory.

The memory in FIG. 8 includes a double data rate (DDR) circuitry in data (DQ) I/O port 804. DDR operation is illustrated in FIG. 7C.

Figure 9:
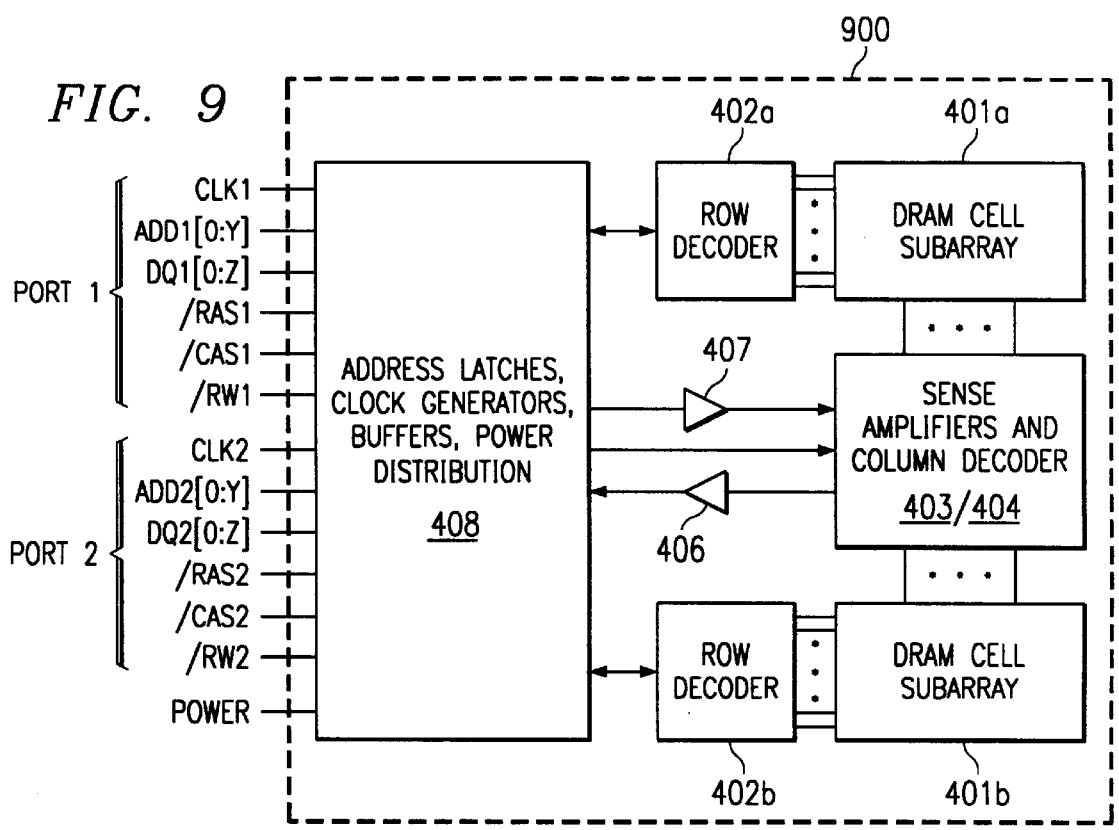
FIG. 9 discloses a multiport memory with fully independent access ports.

FIG. 9 discloses a multiport memory 900 embodying the present inventive concepts. While memory device 900 is very similar to device 400 already discussed, there are some important differences. Primarily, device 900 is fully a multiported device, with the embodiment depicted in FIG. 9 having a pair of independent ports labeled Port1 and Port2 respectively. Port1 includes all the inputs required of a stand alone DRAM including a clock input CLK1, multiplexed address inputs ADD1[0:Y], bidirectional data terminals DQ[0:Z], and inputs for receiving a dedicated set of the traditional DRAM control signals /RAS1, /CAS1 and /RW1. Similarly, Port2 includes a clock input CLK2, multiplexed address inputs ADD2[0:W], bidirectional data terminals DQ2[0:X], and DRAM control inputs /RAS2, /CAS2 and /RW2. Note, that the width of the address and data ports of Port1 do not have to be equal in width to those of Port2. For example, Port1 could be a "by 32" port and Port2 a "by 16" port.

As will be explained later in conjunction with some selected systems applications, the multiport configuration of memory 900 allows two different external devices to access cell array 401 asynchronously and simultaneously. This gives the system designer several degrees of freedom during the design process. Among other things, the two ports can operate using two clocks CLK1 and CLK2 of substantially different frequencies. Alternatively, a single system clock (SCLK) of a given frequency can drive both clock inputs at the same time. Moreover, using the two sets of DRAM control signal inputs, such parameters as the precharge and active cycle timing, /CAS latency, can be independently varied. This will allow, for example, one port to be used for high speed accesses while the other port is used for slower, but less power consuming, accesses. Also, the different ports can be used simultaneously for different types of accesses. For example, one port can be dedicated to the CPU since the CPU may use any one of a number of different memory access types (i.e. random, page or burst) at a given time depending on its need. The other port can then be used to support the peripherals which in the majority of cases are exchanging raw data with memory using burst and serial accesses.

Figure 10A:
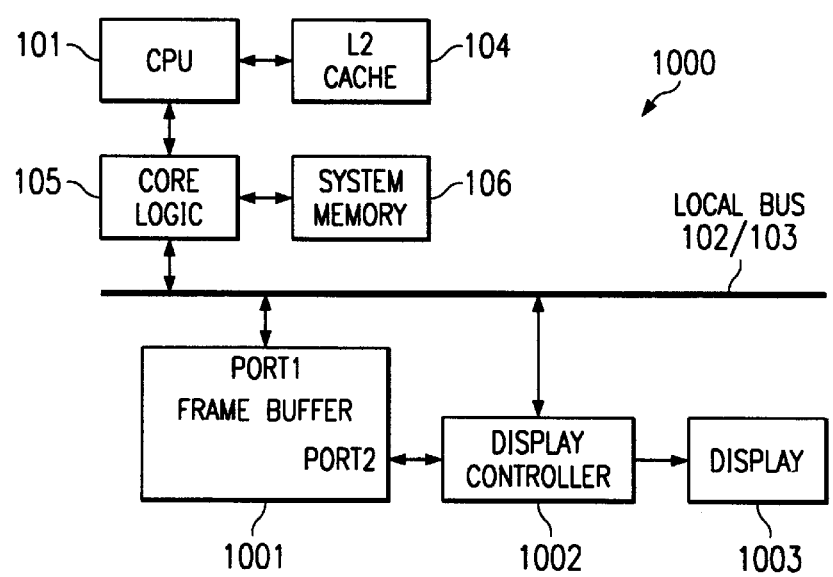
FIG. 10A depicts a portion of an exemplary PC architecture utilizing the multiport memory of FIG. 9.
Figure 10B:
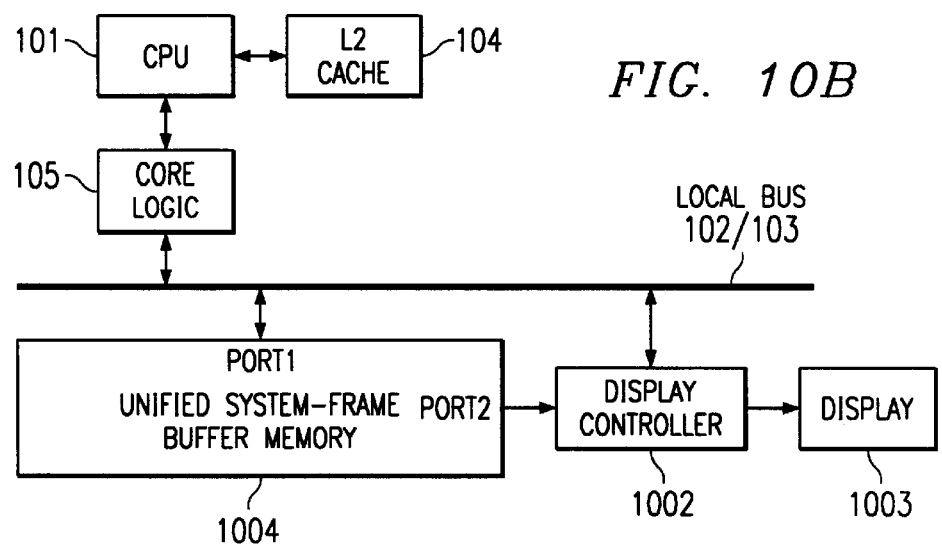
FIG. 10B depicts the system and frame buffer consolidated into a single unified memory space.
Figure 11:
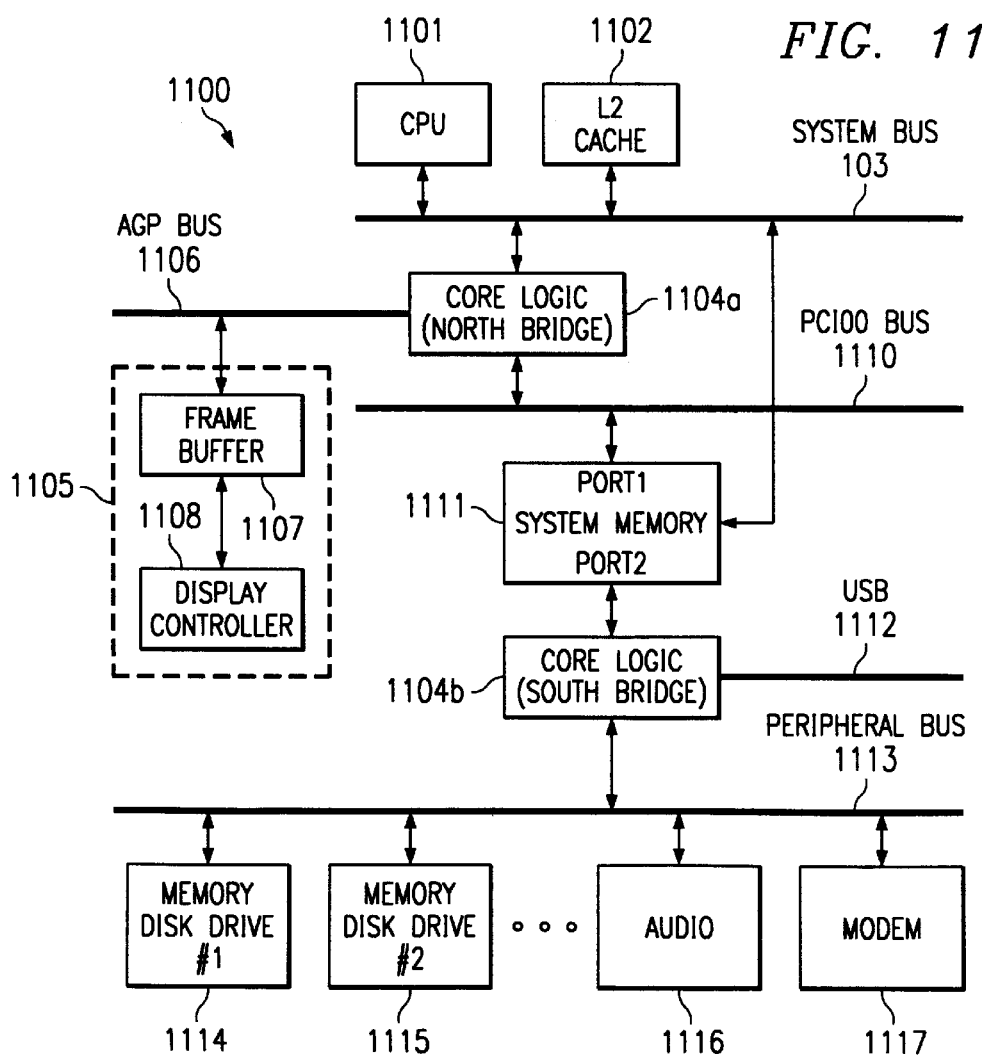
FIG. 11 is a particularly detailed block diagram of a more advanced PC system.

Some examples of multiple processor/controller architectures in which memory 900 can advantageously employed are shown in FIGS. 10A–10B and 11. Again, in each of these systems, two or more devices can access the same memory device/space completely independently and asynchronously. As will become apparent from the discussion below, because the two processors can access the-same memory space, bus traffic and memory contention problems are substantially reduced. In addition, shared local buses in some cases can be eliminated since processing devices can now communicate directly through the memory space, rather than the I/O space.

FIG. 10A depicts a portion of an exemplary PC architecture 1000 similar to those shown in FIGS. 1A and 1B. In FIG. 10A, the display portion of the system is emphasized. Specifically, in addition to the traditional CPU, cache, core logic and system memory discussed above, a frame buffer 1001, display controller 1002 and display device 1003 are also shown. According to the present inventive concepts, frame buffer 1001 is constructed from one or more of the dual-ported memory devices 900 shown in FIG. 9.

This application eliminates the inefficiencies in handling display data found in current memory architectures. In the typical display subsystem, the CPU performs most of the graphics functions such as generating update data, while the display controller's primary task is to control data transfers from the CPU to the frame buffer and from the frame buffer to the display as well as refresh the screen. (The display controller may have some rudimentary graphics functionality such as line drawings, etc.) The process of changing (updating) the display as a result must be performed as follows. First, the CPU writes the screen update data into system memory. Next, the CPU writes the update data into the display controller write buffer, if the write buffer has room. If the display controller write buffer is full, the CPU waits a number of clock cycles until there is room. The display controller then writes the contents of its write buffer into the frame buffer. The next time the display controller rasters through the frame buffer, the display screen is updated using the new data.

As is evident, display updates in conventional systems are unduly complicated and waste clock cycles. In system 1000, since a multiport memory 900 is used in frame buffer 1001, this bottleneck is eliminated. Here, CPU 101 writes update data directly into frame buffer 1001 using Port1 and a timing base (i.e. clocks and DRAM control signals) optimized for CPU 100 and core logic 105. Once the update is made, CPU can immediately return to other tasks until the next update is required.

At the same time, display controller 1002 is independently rastering data from frame buffer 102 to display 1003 using a time base and access type optimal for the transfer. The need for a CPU read from system memory followed by a write to the controller write buffer is eliminated. Consequently, the CPU no longer must wait for display controller write buffer to empty before it can write data. Typically, the rastering can be done at a lower rate using page accessing optimized for display data processing (if such is required by the system) rather than CPU controlled processing. Running at a lower rate also reduces power.

In FIG. 10B similar principles apply. In this case, the system and frame buffer are consolidated into a single "unified" memory space 1004 using a bank of memory devices 900. The display operations are exactly the same as described above. However, since a unified memory 1004 is being used, the frame buffer space (and any other spaces or registers required by the CPU and the software running at the time) can be allocated an area in the operating system and the CPU a necessary to optimize system performance. Again, as described above, Port1 and Port 2 allow independent memory operation optimization for the CPU/core logic and display controller.

FIG. 11 is a particularly detailed block diagram of a more advanced PC system 1100. As in the exemplary systems of FIGS. 1A and 1B, system 1100 is based on a CPU 1101 operating in conjunction with an L2 cache 1102 via system bus 1103. These devices operate substantially as described above and therefore will not be discussed in detail here.

Two chips sets 1104a and 1104b comprise the core logic in this system, with set 1104a being the "north bridge" and set 1104b being the "south bridge." These chips sets are known in the art and available in the marketplace. Single chip (integrated) core iogic are expected to be available in the future, as well.

CPU 1100 and north bridge 1104a transact with display subsystem 1105 via a local graphics bus 1106 such as an AGP bus (Advanced Graphics Peripheral Bus) or the like. Subsystem 1105 includes a frame buffer 1107, preferably comprising one or more memory devices 900, and a display controller 1108. In this configuration, display subsystem 1105 operates as described above in conjunction with FIG. 10A.

The system memory 1109 is constructed from one or more memory devices 900, with Port1 coupled to north bridge 1104a via PC 1100 bus 1110 and Port2 coupled to south bridge 1104b (or vice versa) South bridge 1104b supports communications via Universal Serial Bus 1112 and a peripheral bus (e.g. a PCI, ISA or VESA bus) 1113. Bus 1113 supports the mass storage devices, such as memory disk drives 1114 and 1115 and other peripheral devices such as audio processing circuitry 1116 and modem 1117.

In addition to all the advantages associated with the configuration of display subsystem 1105, the construction and configuration of system memory 1111 substantially enhances the performance of system 1100 vis a vis traditional PC systems. System memory 1100 differs from conventional system memories in at least two very significant respects. First, multiple ports allow different devices in the system to access system memory at the same time thereby reducing arbitration bottlenecks. Second, since each port is independent, the types and timing of the accesses can change as required by the individual subsystems.

In system 1100, Port 1 is primarily used by CPU 1101, through core logic 1104a, to perform either page, burst or random accesses, as required to access and encache data and instructions under the direction of the operating system and applications software. Port1 will therefore typically be running at a relatively high clock rate.

Figure 12A:
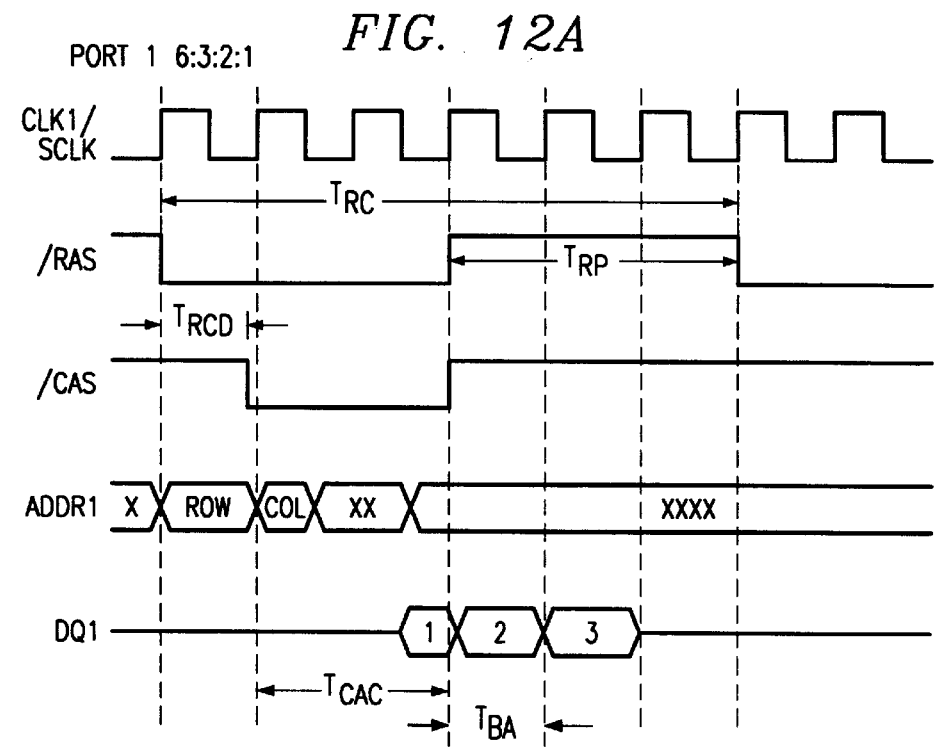
FIG. 12A shows a typical high speed access to one port of a multiport memory such as that shown in FIG. 9; and FIG.

In the specific case of a CPU access to system memory, the critical factor is the speed at which a random access or the first access of a burst or page can be performed. A typical high speed access may have a timing ratio of 6:3:2:1 as shown in FIG. 12A. This ratio represents the relationship between the port timing parameters where: 6:3:2:1= Trc:Trp:Tcac:Tba and Trc is the time for one complete /RAS period, Trp is the precharge time (/RAS high), Tcac is the column access time for a random access or the first access in a burst or page, and Tba is the column access time for the following accesses during a burst on page access). Considering a 100 MHz clock, a symmetric /RAS will have a period Trc of 60 nsecs (6 clock periods), with 30 nsecs (3 clock periods) each for the active and precharge period. For a burst access, the first valid data is available, worst case, 20 nsec after the fall of /CAS (Tcac) and subsequently, valid data is available, worst case, every 10 nsecs (Tba).

Port2 supports the lower speed bus 1113 through core logic 1103b. Advantageously, data from a given mass storage device can be loaded into system memory 111 using bursting or paging without substantially interfering with accesses by the CPU or the high speed data transfers on PCI bus. In other words, Port2 can be used to support devices working at a lower clock frequency and/or memory operations such as data streaming where the delay to the first access is not as critical as maintaining a sustained or peak bandwidth. As already indicated, reduced speed equates with reduced power.

Figure 12B:
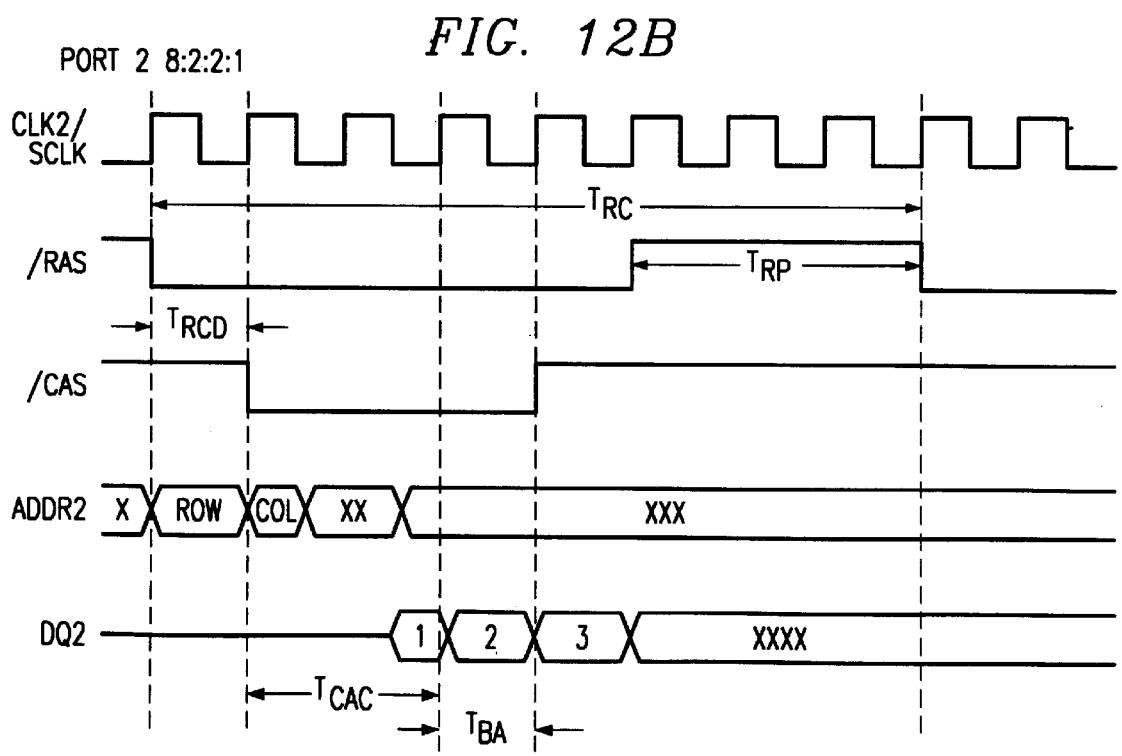

For Port2, consider the 8:2:2:1 timing shown in FIG. 12B. In this case, the /RAS active period is extended to 6 clock periods (the precharge period is now 2 clock periods) which can support longer bursts or pages. The remaining parameters are essentially the same as in FIG. 12A. However, also consider the fact that the clock used with Port 2 may also be running at a lower frequency relative to Port 1, for example 66 MHz. In this case, each clock period is approximately 16 nsec, the active /RAS period is approximately 128 nsecs and the first valid data is available 32 nsecs after the fall or /RAS.

As one final exemplary application of the present concepts, consider multiprocessing system 200C shown in FIG. 2C. In this case, there is a general system memory 210 available to all CPUs 210 and a private of local memory 209 dedicated to each individual CPU. Assume now that each private memory 209 ("private memory" dedicated to a given CPU) is constructed from one or more memories 900, with Port1 dedicated to the respective CPU 201 and Port2 coupled to the system bus as depicted in dashed lines. In this case, each CPU 201 can continue to access its private memory 209 through using its own timing and without interruption. At the same time, another CPU 201 can not only make an update to the main system memory 210, but it can also update the data in the private memory of one or more of the other CPUs. In this fashion, each CPU can be working on the most current data notwithstanding any updates made asynchronously by another.

While a few examples have been discussed here, the present inventive concepts can applied in numerous other situations in which: (1) two different processing resources require simultaneous access to the same memory; (2) those processing resources generally require different types of memory accesses; and/or (3) those processing resources are performing the simultaneous accesses using different timing parameters Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A frame buffer memory comprising:
   an array of rows and columns of memory cells, each row associated with first and second wordlines and each column associated with first and second bitlines;
   a first port for accessing selected ones of said memory cells using said first wordline and said first bitline of corresponding ones of said rows and columns, said first port associated with first dedicated sets of address, data, clock and control signal terminals for supporting accesses by a CPU using a time base and access type required by said CPU; and a second port for accessing selected ones of said memory cells using said second wordline and said second bitline of corresponding ones of said rows and columns, said second port associated with second dedicated sets of address, data, clock and control signal terminals for supporting access by a display controller using a time base and access type required by said display controller.

2. The memory of claim 1 wherein said first port is operating in response to a first clock of a first frequency and said second port is operating in response to a second clock of a second frequency, said first frequency being greater than said second frequency.

3. The memory of claim 1 wherein said first and second ports are operating in response to a single system clock.

4. The memory of claim 1 wherein said frame buffer comprises a portion of a unified frame buffer-system memory.

5. The memory of claim 1 wherein timing parameters for said first port are in a first ratio and timing parameters for said second port are in a second ratio.

6. The memory of claim 1 wherein said control signals comprise /RAS and /CAS.

7. The memory of claim 1 wherein said memory comprises a synchronous DRAM.

8. The memory of claim 1 wherein said memory cells comprises 2T-1C dynamic random access memory cells.

9. A frame buffer comprising:

a first port having dedicated address, data and control signal inputs for updating display data within said memory using timing parameters and accesses types optimized for use with a selected processing device; and a second port having dedicated address, data and control signal inputs for supporting simultaneous and asynchronous accesses to said frame buffer by a display controller.

10. The frame buffer of claim 9 and further comprising:

an array of rows and columns of memory cells, each memory cell including a capacitor and first and second pass transistors, said first pass transistor for coupling said capacitor to a first bitline in response to an active signal on a first wordline and said second pass transistor for coupling said capacitor to a second bitline in response to an active signal on a second wordline, said first port for accessing a selected cell using said first bitline and said first wordline and said second port for accessing a selected cell using said second bitline and said second wordline.

11. The frame buffer of claim 9 wherein said array comprises a stand-alone frame buffer.

12. The frame buffer of claim 9 wherein said array comprises an allocable memory space in a unified frame-buffer-system memory.

13. The frame buffer of claim 9 wherein said processing device comprising a CPU.

14. A processing system comprising:

first core logic operating in accordance with a first clock and a first set of memory access parameters;

second core logic operating in accordance with a second clock and a second set of memory access parameters; and a multiport memory comprising:

a first port coupled to the first core logic and operating in accordance with the first clock and the first set of access parameters;

a second port coupled to the second core logic and operating in accordance with the second clock and the second set of access parameters; and an array of rows and columns of memory cells, each memory cell including a capacitor and first and second pass transistors, the first pass transistor for coupling the capacitor to a first bitline in response to an active signal on a first wordline and the second pass transistor for coupling the capacitor to a second bitline in response to an active signal on a second wordline, the first port accessing a selected cell using the first bitline and the first wordline and the second port accessing a selected cell using the second bitline and the second wordline.

15. The system of claim 14 wherein the first processing device comprises a CPU and the second processing device comprises a display controller.

16. The system of claim 14 wherein the first processing device is operating in response to a first clock of a first frequency and the second processing device is operating in response to a second clock of a second frequency.

17. The system of claim 16 wherein the first and second frequencies differ.

18. The system of claim 14 wherein the first set of access parameters are in a first predetermined ratio and the second set of access parameters are in a second predetermined ratio.

19. The system of claim 18 wherein the first and second predetermined ratios differ.

* * * * *